(12) United States Patent
Haruta (10) Patent No.: US 7,049,897 B2
(45) Date of Patent: May 23, 2006

(54) HIGH FREQUENCY BAND OSCILLATOR

(75) Inventor: Kazumasa Haruta, Sagamihara (JP)

(73) Assignee: Murata Manufacturing Co., Ltd. (JP)

( * ) Notice: Subject to any disclaimer, the term of this patent is extended or adjusted under 35 U.S.C. 154(b) by 0 days.

(21) Appl. No.: 10/315,948

(22) Filed: Dec. 11, 2002

(65) Prior Publication Data
US 2003/0112085 A1    Jun. 19, 2003

(30) Foreign Application Priority Data

Dec. 12, 2001  (JP) .............................. 2001-378771
Oct. 28, 2002  (JP) .............................. 2002-313229

(51) Int. Cl.
*H03B 5/18*      (2006.01)
(52) U.S. Cl. .............. 331/96; 331/107 G; 331/107 DP; 331/107 SL; 331/68; 331/67
(58) Field of Classification Search .......... 331/107 SL, 331/107 DP, 107 G, 96, 67, 68
See application file for complete search history.

(56) References Cited

U.S. PATENT DOCUMENTS 3,858,123 A * 12/1974 Ohta et al. ............ 331/107 DP
4,325,035 A    4/1982 Nishikawa et al.
4,386,326 A    5/1983 Yoshimura
4,426,628 A * 1/1984 Malecki et al. ................ 331/96

FOREIGN PATENT DOCUMENTS

| JP | 58 02 0009 | 2/1983 |
| JP | 2002-313229 | 10/2002 |
| JP | 2001-378771 | 12/2002 |

* cited by examiner

*Primary Examiner*—Arnold Kinkead
(74) *Attorney, Agent, or Firm*—Dickstein, Shapiro, Morin & Oshinsky, LLP.

(57) ABSTRACT

In an oscillator used in a high frequency band such as the microwave band, the millimeter wave band, etc., an oscillation element and circuit components such as a resonator coupled to the oscillation element, etc., are provided inside a casing, the oscillation element is disposed inside a cavity having at least one opening portion, and a part or the whole of the resonator is disposed outside the cavity.

5 Claims, 11 Drawing Sheets

FIG. 11 – PRIOR ART

HIGH FREQUENCY BAND OSCILLATOR

BACKGROUND OF THE INVENTION

1. Field of the Invention

The present invention relates to an oscillator used in a high frequency band such as the millimeter wave band, etc., and more particularly to a high-frequency oscillator in which the construction of the area where an oscillation element and a resonator are coupled is improved.

2. Description of the Related Art

An oscillator to be used in a high frequency band such as the millimeter wave band, etc., has been disclosed in Japanese Unexamined Patent Application Publication No. 2001-102871 (Reference No. 1). In that document, an oscillation circuit is constructed by providing a microstrip line and a Gunn diode on a dielectric substrate. Furthermore, a dielectric microstrip line is disposed between upper and lower conductor plates to construct an NRD guide (nonradiative dielectric waveguide) as an output transmission line. The above microstrip line in the oscillation circuit and the NRD guide are coupled.

In that oscillator, the cut-off frequency of the NRD guide is set so that the fundamental wave in an oscillation signal in the oscillation circuit is cut off and the harmonics are propagated. Accordingly, in an oscillator making use of the harmonics, the fundamental wave can be sufficiently suppressed and low loss can be realized.

Figure 10:
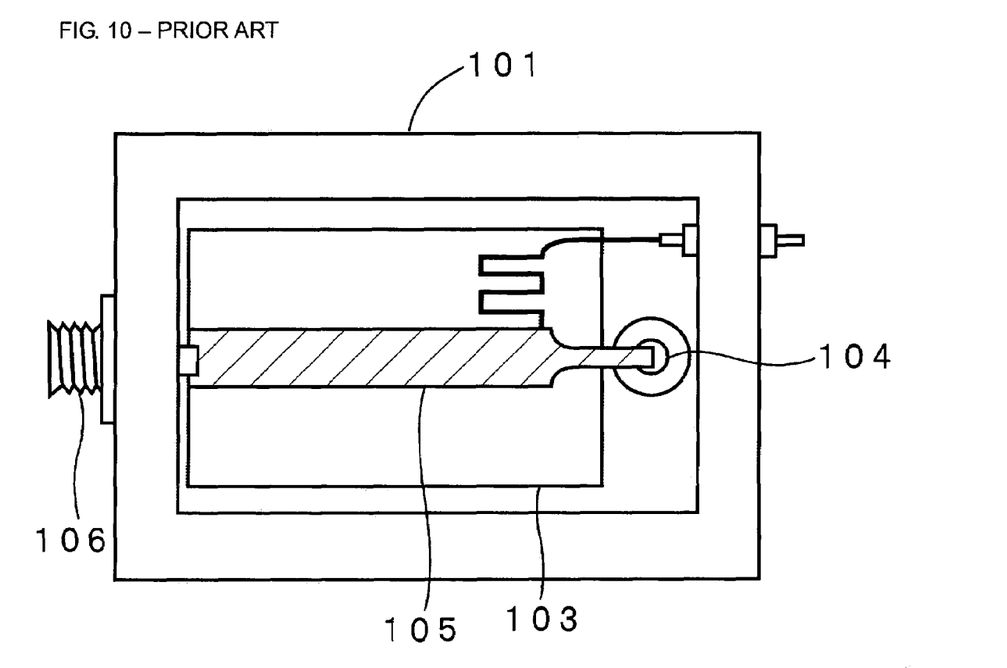
FIG. 10 is a top sectional view showing one example of a related millimeter wave oscillator.
Figure 11:
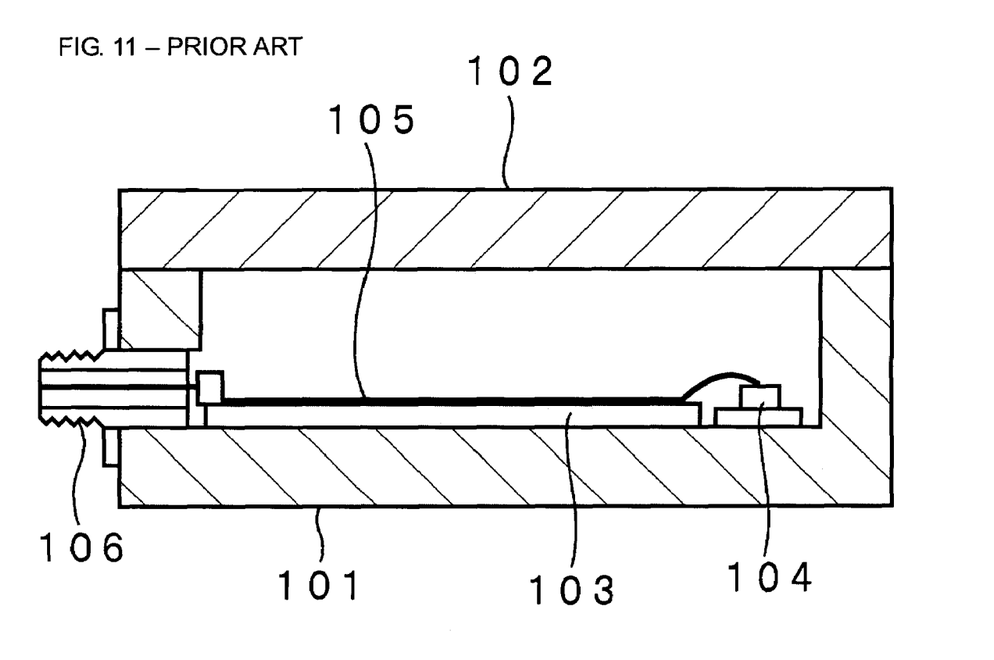
FIG. 11 is a front sectional view of the related millimeter wave oscillator.

On the other hand, in the Japanese Unexamined Patent Application Publication No. 7-212131 (Reference No. 2), a millimeter wave oscillator shown in FIGS. 10 and 11 is disclosed. In that oscillator, a case is composed of a casing main body 101 and a lid 102, and a dielectric substrate 103 and a Gunn diode 104, serving as an oscillation element, are disposed inside the casing main body 101. The Gunn diode 104 is coupled to a metal microstrip line formed on the substrate 103. The other end, opposite to the side to which the Gunn diode is coupled, of the metal microstrip line 105, is connected to a high frequency connector 106.

In these millimeter wave oscillators described above, the inside height and width of a section, perpendicular to the direction of transmission of an oscillation output, of the case are set to be one half of the wavelength of the oscillation or smaller, and accordingly the oscillator can be made smaller and the productivity can be increased.

In the oscillator described in the above Reference No. 1, although the fundamental wave as an unwanted mode can be suppressed, leakage of the unwanted mode cannot be sufficiently prevented only by setting the cut-off frequency of the NRD guide as described above, and accordingly the oscillation output cannot be obtained in an efficient and stable way.

On the other hand, in the millimeter wave oscillator described in the above Reference No. 2, the inside dimensions of a section, perpendicular to the direction of transmission of an oscillation output, of the case are set to be one half of the wavelength of the oscillation or smaller. Accordingly, for example, when the wavelength of the oscillation becomes on the order of 76 to 77 GHz, the inside dimensions of the case become as small as 1.95 to 1.97 mm. That is, it is inevitable that the height and width of the case have such small dimensions. Therefore, there is a problem in that it becomes difficult to house the resonator coupled to the oscillation element and other circuit components inside the case.

SUMMARY OF THE INVENTION

Accordingly, it is an object of the present invention to provide a high-frequency oscillator in which miniaturization and circuit construction inside a case are made easy.

It is another object of the present invention to provide a high-frequency oscillator in which not only are miniaturization and circuit construction inside a case made easy, but also the oscillation output can be increased.

It is another object of the present invention to provide a high-frequency oscillator in which not only are miniaturization and circuit construction inside a case made easy, but also unwanted modes can be effectively suppressed.

According to the present invention, an oscillator used in a high frequency band includes an oscillation element, and a resonator coupled to the oscillation element. In the oscillator, the oscillation element is disposed inside a cavity having at least one opening portion and a portion or the whole of the resonator is disposed outside the cavity. The cavity having the at least one opening portion is provided in a case.

In the present invention, since a part or the whole of a resonator is disposed outside the cavity, that is, since it is not necessary to dispose the resonator coupled to the oscillation element and other components inside the cavity, the cavity can be made smaller. Furthermore, since the internal dimensions of the casing are not restricted, the circuit of the oscillator can be freely constructed by making use of the inside and outside of the cavity.

In the present invention, the shape of the at least one opening portion provided in the cavity is determined so as to extract only an oscillation output in a desired mode. That is, since the shape and dimensions of the opening portion of the cavity is formed to cut off unwanted modes, the efficiency of the output can be increased.

In the present invention, the resonator is disposed completely outside the cavity. Accordingly, the cavity can be made smaller and there is a great amount of freedom by arranging the resonator, etc., outside the cavity.

In the present invention, the oscillation element and the resonator are coupled inside the cavity and the resonance frequency of the cavity is away from the fundamental frequency of a mode to be used and frequencies of higher modes. Accordingly, the oscillation of unwanted modes due to the resonance of the cavity is suppressed.

In the present invention, any appropriate oscillation element used in the millimeter wave band, etc., can be used as the above-mentioned oscillation element. For example, an FET, a Gunn diode, etc., can be used.

In the present invention, an appropriate resonator used in a high frequency band, for example, a microwave stripline resonator or a dielectric resonator, can be used as the resonator.

DESCRIPTION OF THE PREFERRED EMBODIMENTS

Hereinafter, the present invention will be explained by describing concrete embodiments of the invention with reference to the drawings.

Figure 1:
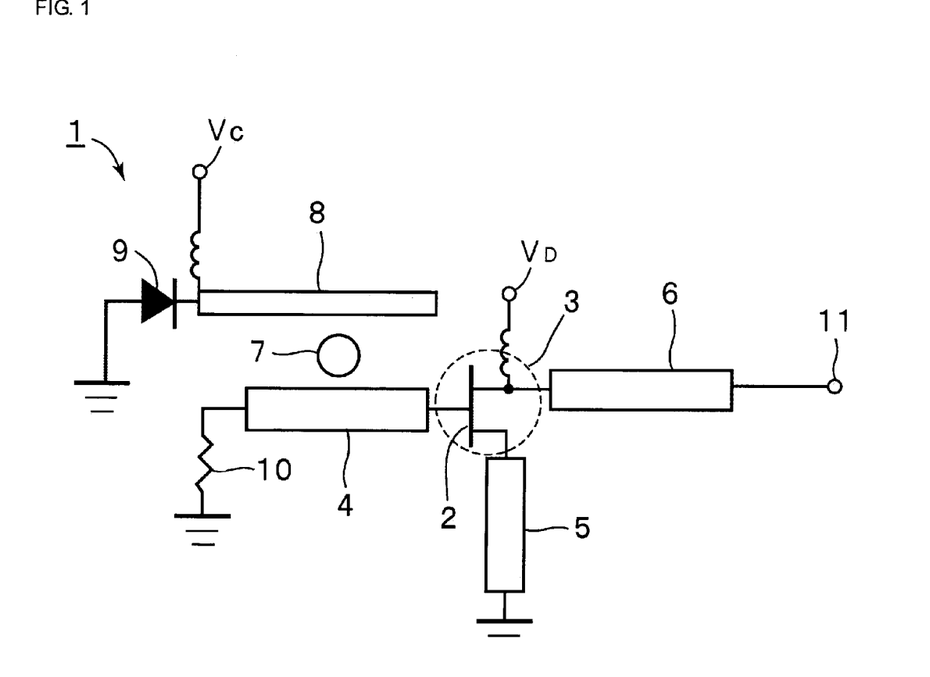
FIG. 1 shows the construction of an oscillator according to a first embodiment of the present invention.

FIG. 1 shows the construction of an oscillator according to a first embodiment of the present invention.

In the oscillator of the present embodiment, an oscillation element 2 made up of an FET is disposed in a cavity 3, which is shown in a simplified form by a broken line. The cavity 3 is a space enclosed by a conductive material. For example, it is constructed such that the space is enclosed by a metal, etc. An oscillator 1 of the present embodiment contains the above oscillation element 2; resonators 4 and 5 and a microstrip line 6, which are coupled to the oscillation element 2; a dielectric resonator 7; a microstrip line 8; and a varactor diode 9.

The resonator 4 made up of a microstrip line coupled with the dielectric resonator 7 is connected to the gate electrode of the FET constituting the oscillation element 2 and the other end of the resonator 4 is grounded through a resistor 10. The dielectric resonator 7 is coupled to the resonator 4 and the microstrip line 8 is coupled to the dielectric resonator 7. One end of the microstrip line 8 is connected to a control voltage Vc and to the cathode of the varactor diode 9. The anode of the varactor diode 9 is grounded.

On the other hand, the drain electrode of the FET constituting the oscillation element 2 is connected to a drain voltage VD and to the microstrip line 6. A high-frequency oscillation output is extracted from the end of the microstrip line 6.

Furthermore, the resonator 5 is connected to the source electrode of the FET and the other end of the resonator 5 is grounded.

The oscillation element 2 is oscillated by supplying the drain voltage VD, and an oscillation output modulated by the control voltage Vc is extracyed from an RF output terminal 11.

The oscillator 1 of the present embodiment is characterized in that only the oscillation element 2 is housed inside the cavity 3 and the other circuit components, that is, the resonators 4, 5, and 7, the microstrip lines 6 and 8, and the varactor diode 9 are disposed outside the cavity 3. The cavity 3 can be made smaller as long as the cavity 3 has enough space for housing the FET. Furthermore, although all of these components are placed in a casing which is not illustrated, since the internal dimensions of the case are not restricted, even if a higher-frequency oscillator is constructed, there is a greater amount of freedom for arranging the resonators 4, 5, and 7, the microstrip lines 6 and 8, the varactor diode 9, etc., in the case and, as a result, the circuit can be easily constructed.

Figure 2:
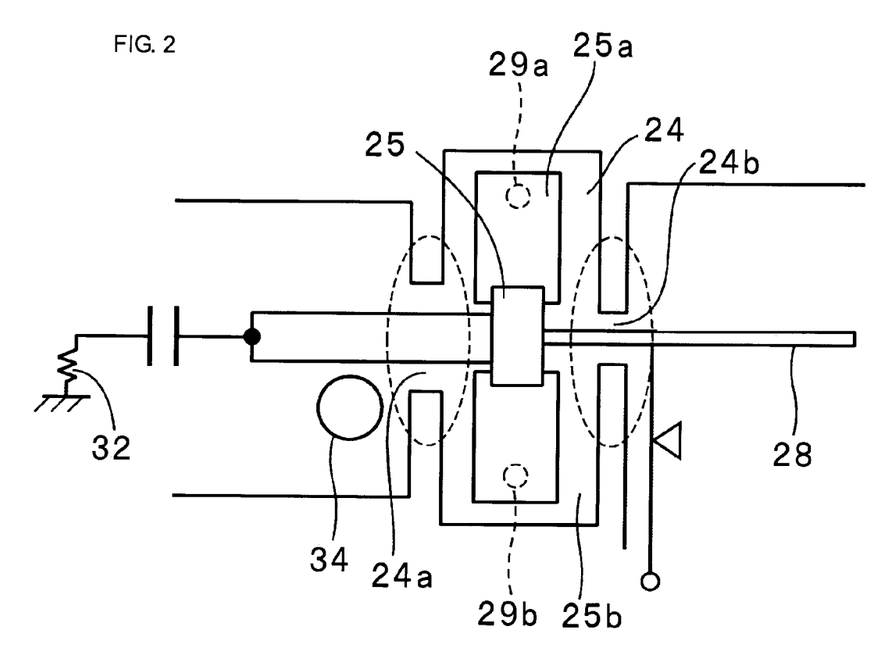
FIG. 2 shows the construction of an oscillator according to a second embodiment of the present invention.
Figure 3:
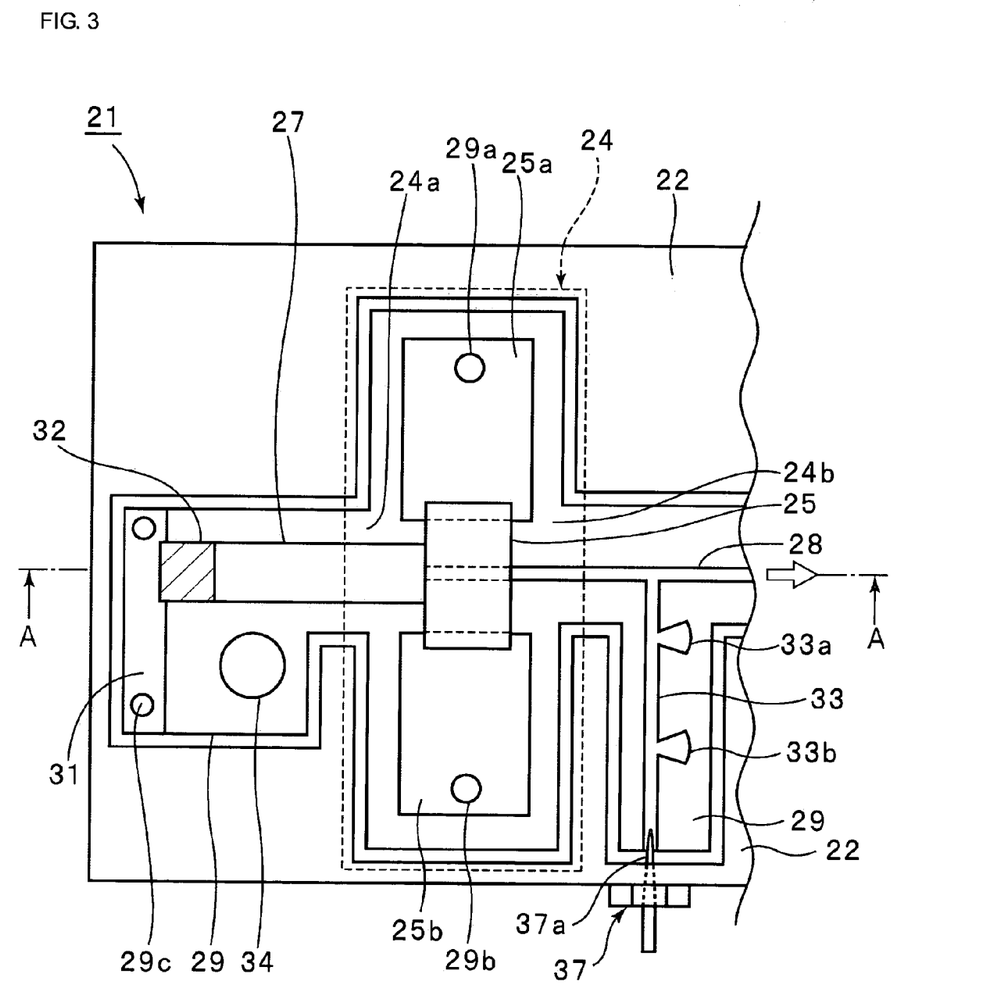
FIG. 3 is a top view showing an example of the construction of the oscillator of the second embodiment.
Figure 4A:
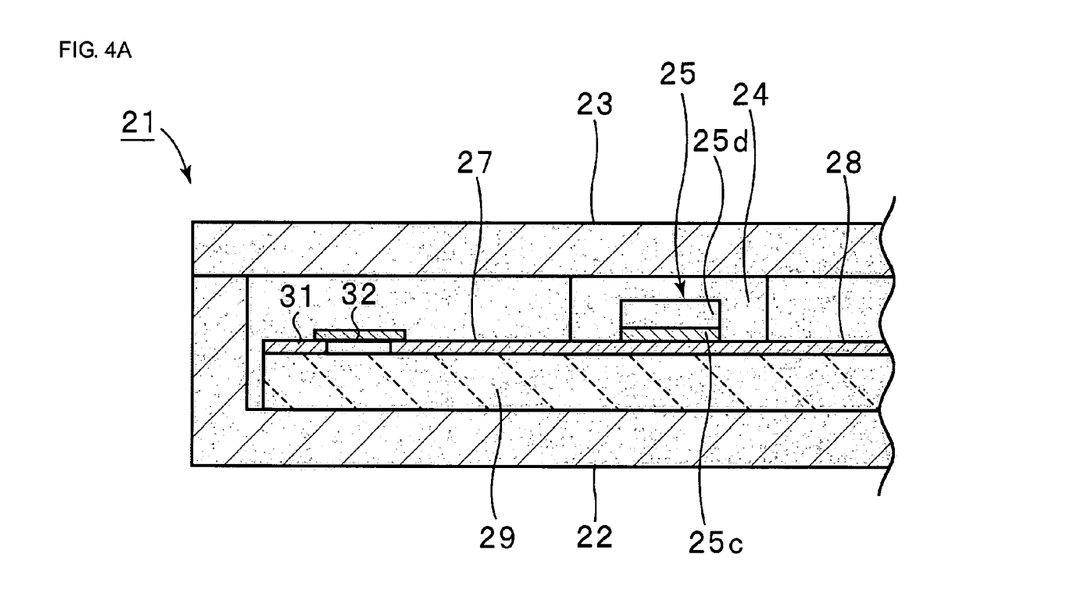
FIG. 4A is a cross-sectional view of the oscillator taken through line A—A of FIG. 3.
Figure 4B:
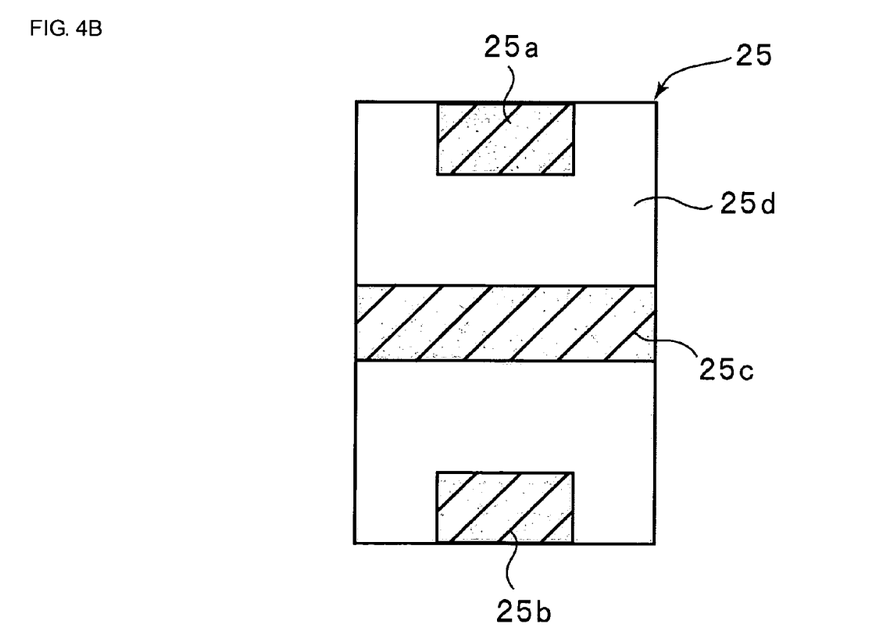
FIG. 4B is a bottom view of an oscillation element used in the oscillator shown in FIG. 3.

FIG. 2 shows the construction of an oscillator according to a second embodiment of the present invention, FIG. 3 is a top view of the oscillator, FIG. 4A is a cross-sectional view of the oscillator taken through line A—A of FIG. 3, and FIG. 4B is a bottom view of an oscillation element used in the oscillator.

As shown in FIG. 3, FIG. 4A, and FIG. 4B, an oscillator 21 contains a casing main body 22 and a lid 23 formed of a metal such as aluminum, etc. The casing is made up of the casing main body 22 and the lid 23.

The material constituting the casing main body 22 and the lid 23 may be not only a metal, but also an insulating material such as a synthetic resin, etc., on the surface of which a conductive layer is formed.

Inside the casing made up of the casing main body 22 and the lid 23, a cavity 24 is formed, as shown in FIG. 4A. The cavity 24 is an area enclosed by the casing main body 22 and the lid 23, and an oscillation element 25 is housed in the cavity 24. In the present embodiment, a chip Gunn diode is used as the oscillation element 25.

As shown in FIG. 4B, electrodes 25a, 25b, and 25c are formed on the back side of the main body 25d of the oscillation element 25.

Furthermore, as shown in FIG. 3, a pair of opening portions 24a and 24b facing each other are formed in the cavity 24. A resonator 27 made up of a microstrip line coupled with a dielectric resonator 7 is extended from the outside of the cavity 24 to the inside of the cavity 24 through the opening portion 24a and is coupled to the oscillation element 25. An RF output line 28 is disposed so as to extend from the outside of the cavity 24 to the inside of the cavity 24 through the opening portion 24b. On end of the RF output line 28 is connected to the electrode 25c of the oscillation element 25 and an RF output is extracted from the other end.

The resonator 27 made up of the above RF output line 28 and the microstrip line is formed on a circuit board 29 fixed on the casing main body 22. Furthermore, the above-described oscillation element 25 is fixed on the circuit board 29.

The circuit board 29 is constructed by using, for example, an insulating ceramic such as alumina, etc. A via hole electrode 29c is formed in the circuit board 29. On the circuit board 29, a grounding electrode 31 is formed so as to be connected to the via hole electrode 29c and a resistor 32 is provided so as to be connected between the grounding electrode 31 and the resonator 27 made up of the microstrip line.

On the other hand, a DC bias line 33 is formed on the circuit board 29 so as to be connected to the RF output line 28. Open stubs 33a and 33b are integrally formed in the DC bias line 33.

The other end of the DC bias line 33 is connected to the core wire 37a of a DC connector 37.

In FIG. 3, the grounding electrodes 25a' and 25b' to be connected to the electrodes 25a and 25b of the oscillation element 25 are formed inside the cavity 24. The grounding electrodes 25a' and 25b' are connected to via electrodes 29a and 29b formed in the circuit board 29, and the via electrodes 29a and 29b are connected to grounding electrode (not illustrated) formed on the lower surface of the circuit board 29.

Furthermore, a dielectric resonator 34 is disposed inside the casing so as to be coupled to the resonator 27 formed of the above-described microstrip line.

The oscillator 21 of the present embodiment is characterized in that, in the same way as in the first embodiment, the oscillation element 25 is housed in the cavity 24 formed in a part of the casing. Furthermore, the above opening portions 24a and 24b are formed in the cavity 24, and the shape and dimensions of the opening portions 24a and 24b are set such that undesirable modes, that is, modes other than the transmission mode to be used, are suppressed, that is, unwanted frequencies are cut off. Therefore, leakage of high frequency outputs in unwanted modes to the outside of the cavity 24 is reliably suppressed.

Furthermore, in the present embodiment, although a part of the resonator 27 coupled to the oscillation element 25 is disposed inside the cavity 24, some of the circuit components constituting the oscillator, except for the oscillation element 25 itself, may be disposed inside the cavity 24. In such a case, only the oscillation element 25 and some of the circuit components are housed inside the cavity 24, and the other circuit components can be freely disposed outside the cavity without having dimensional restrictions imposed thereon. Accordingly, in the same way as in the first embodiment, there is a greater amount of freedom of the circuit construction inside the case in the case of the oscillator 21.

Figure 5:
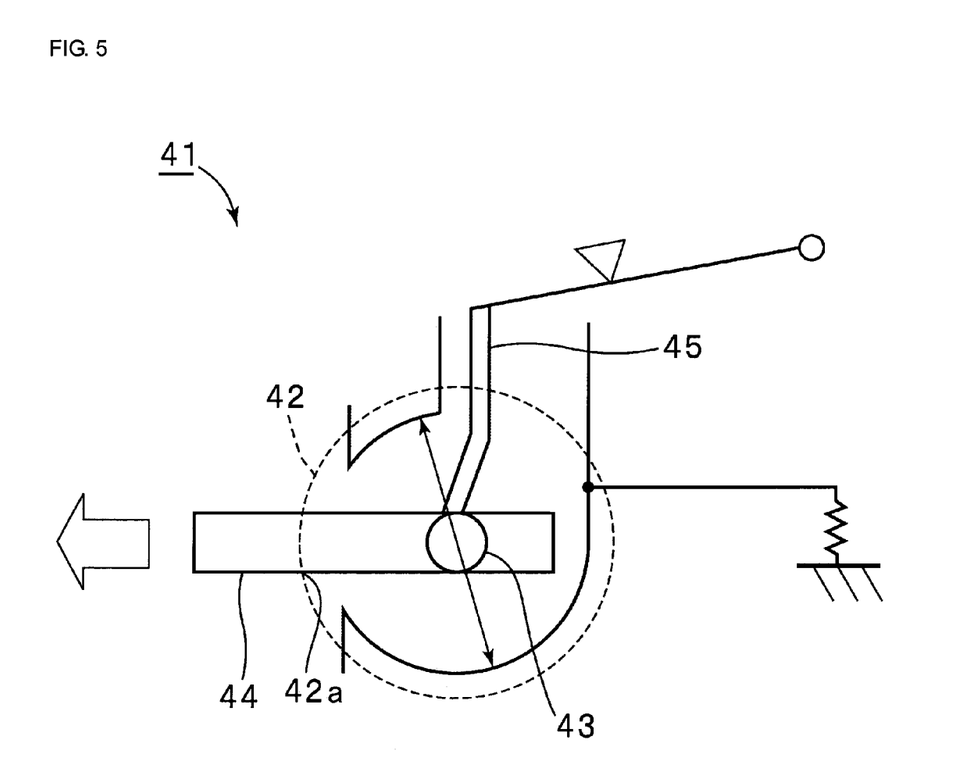
FIG. 5 shows the construction of an oscillator according to a third embodiment of the present invention.
Figure 6:
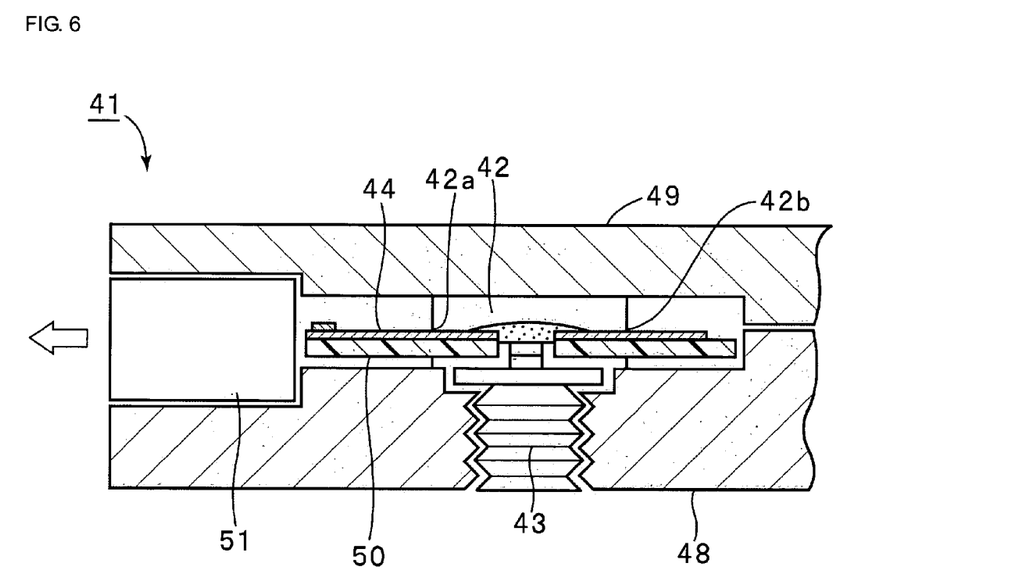
FIG. 6 is a partially cutaway sectional view of the oscillator according to the third embodiment.

FIG. 5 shows the construction of an oscillator according to a third embodiment of the present invention and FIG. 6 is a partially cutaway sectional view of the oscillator.

As shown in FIG. 5, in an oscillator 41 of the present embodiment, a resonator 44 made up of an oscillation element 43 and a microstrip line is disposed inside a cavity 42 shown in the schematic illustration. In the present embodiment, the oscillation element 43 is formed of a Gunn diode and is coupled to the resonator 44.

Furthermore, the resonator 44 is extended outside the cavity 42 through an opening portion 42a provided in the cavity 42, and the resonator 44 is constructed such that a high-frequency oscillation output is extracted from the portion of the resonator 44 outside the cavity 42. On the other hand, a bias line 45 is formed so as to extend from the inside of the cavity 42 to the outside of the cavity 42. That is, the bias line 45 is extended from the inside of the cavity 42 to the outside of the cavity 42 through an opening portion 42b provided in the cavity 42.

As shown more concretely in FIG. 6, a casing is formed of a casing main body 48 and a lid 49, and the casing main body 48 and the lid 49 are constructed of, for example, a metal such as aluminum, etc. Then, the cavity 42 in which the oscillation element 43, etc., are housed is formed by the casing main body 48 and the lid 49. Therefore, the inside surface of the cavity 42 is formed of a metal, such as aluminum, etc.

Furthermore, in the same way as in the second embodiment, the above resonator 44 and bias line 45 are formed on a circuit board 50 disposed inside the casing. The circuit board 50 is constructed by using, for example, a synthetic resin such as fluorine resin, etc., and the resonator 44 and the bias line 45 are formed on the circuit board 50 by patterning a conductive film.

Furthermore, a dielectric line 51 for outputting an RF output signal is disposed so as to extend from the inside of the casing formed of the casing main body 48 and the lid 49 to the outside of the casing, and the dielectric line 51 is coupled to the resonator 44.

Also, in the present embodiment, the oscillation element 43 formed of a Gunn diode is housed inside the cavity 42 within a limited part of the casing, and only the resonator 44 and a part of the bias line 45 are housed inside the cavity 42. Accordingly, the circuit portion made up of the other components can be easily constructed in the case portion outside the cavity 42.

Moreover, in the present embodiment, the shape and dimensions of the opening portions 42a and 42b are determined such that unwanted oscillation frequencies are cut off. Accordingly, in the same way as in the second embodiment, leakage of unwanted modes to the outside of the cavity is reliably suppressed.

More concretely the shape of the opening portions 42a and 42b is rectangular and their width and height are one half of the wavelength of a 76 GHz band or less.

Figure 7:
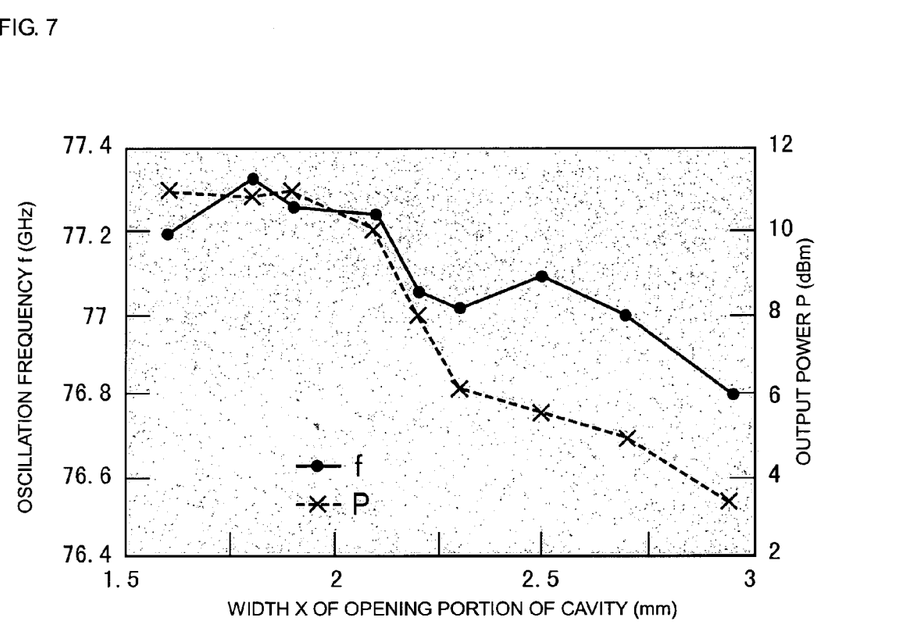
FIG. 7 shows the relationship between the width of the opening portion of the cavity and the oscillation frequency and output power of the oscillator according to the third embodiment.
Figure 8:
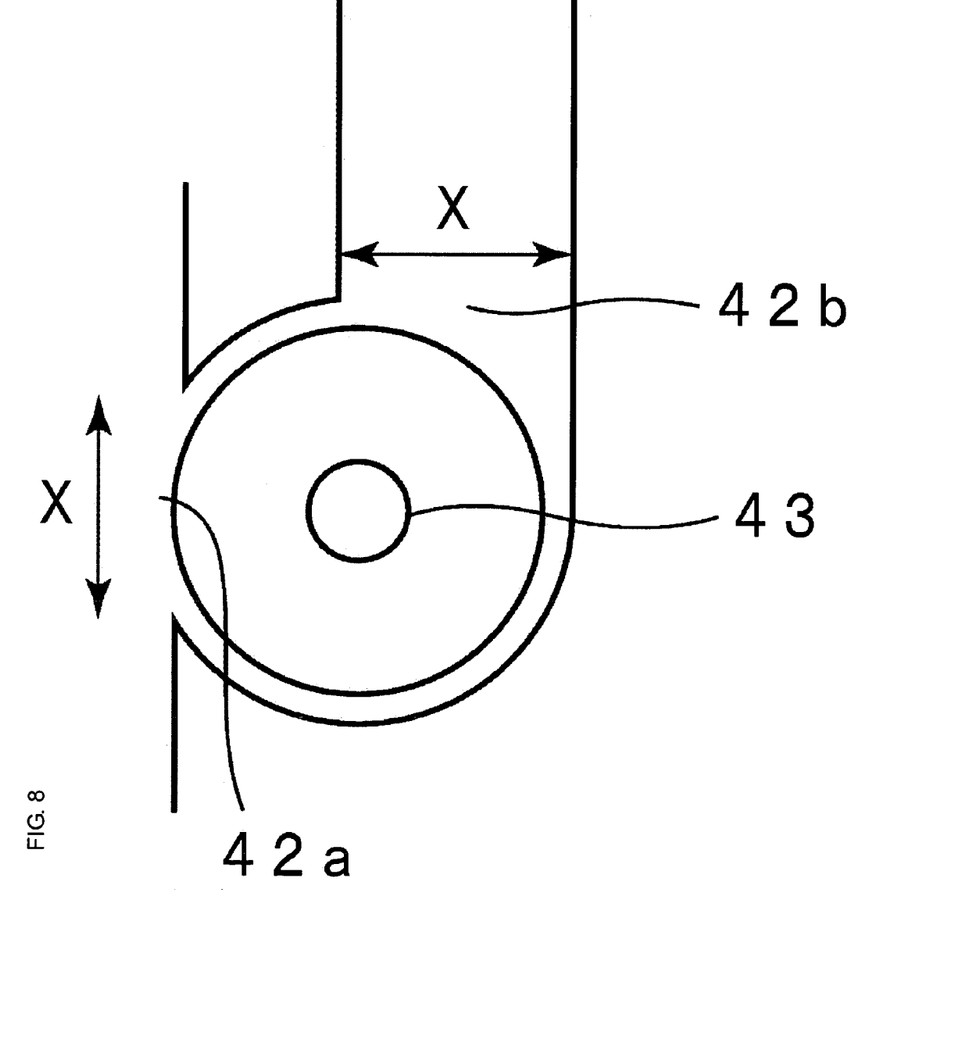
FIG. 8 is a schematic top view for describing the dimensions of the opening portion of the cavity.

FIG. 7 shows the relationship between the oscillation frequency f and output power P of the oscillator of the present embodiment with respect to the width X of the above opening portions 42a and 42b, and FIG. 8 is a schematic top view for describing the width X of the opening portions 42a and 42b. Moreover, the height of the opening portions 42a and 42b is made the same as the width X.

As is clearly understood from FIG. 7, the output voltage can be effectively increased by making the width and height of the opening portions 42a and 42b one half of the wavelength of the oscillation frequency or less.

Furthermore, in the oscillator 41 of the present embodiment, the resonance frequency of the cavity 42 is made more than 2% higher than the oscillation frequency, and thus the leakage of unwanted modes caused by the resonance frequency of the cavity is reliably suppressed. This is described with reference to FIG. 9.

Figure 9:
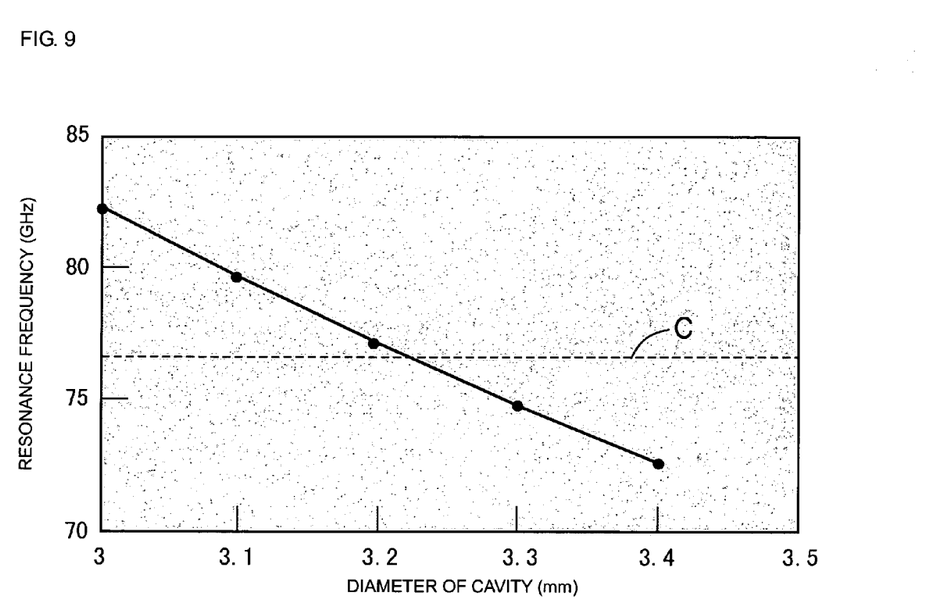
FIG. 9 shows the relationship between the diameter of the cavity and the resonance frequency.

Since the cavity 42 is enclosed by a metal, the cavity itself resonates at a certain frequency. When the cavity 42 is cylindrical, the resonance frequency of a resonator formed by the cavity 42 is dependent on the diameter of the cavity 42, as shown in FIG. 9. That is, the more the diameter of the cavity 42 is increased, the more the resonance frequency of the resonance mode due to the cavity 42 is decreased. Accordingly, in order to obtain a 76 GHz-band oscillation output, it is desirable that the resonance frequency of the cavity be away from 76 GHz, as can be clearly seen from FIG. 9. In this case, if the resonance frequency due to the cavity 42 is made lower than 76 GHz, higher modes have undesirable effects. Accordingly, more preferably the resonance frequency due to the cavity 42 is set to be higher than the oscillation frequency 76 GHz. That is, the size of the cavity 42 is set so as to have a resonance frequency higher than a broken line C in FIG. 9. Preferably, the dimensions of the cavity 42 are set so that the resonance frequency may become at least 2% higher than the oscillation frequency, and thus adverse effects of unwanted modes due to the resonance of the cavity 42 can be reliably suppressed.

As described above, in an oscillator according to the present invention, an oscillation element is disposed inside a cavity having at least one opening portion, which is provided in a casing, and a part or the whole of a resonator is disposed outside the cavity. Therefore, the space for housing the oscillation element can be made smaller by housing the oscillation element inside the cavity, which is restricted to part of the casing, and the circuit components such as the resonator, etc., except for the oscillation element, can be freely disposed outside the cavity. As a result, since the dimensions of the casing are not restricted, there is a greater amount of freedom for arranging the circuit components constituting the oscillator.

Furthermore, when the shape of opening portions provided in the above cavity set so as to extract only an oscillation output in a desired mode, leakage of undesired modes to the outside of the cavity can be reliably suppressed.

When the resonance frequency of the cavity is away from the fundamental frequency in a mode to be used and frequencies in higher modes, leakage of unwanted modes due to the resonance of the cavity can be reliably suppressed.

What is claimed is:

1. An oscillator used in the high frequency band comprising:
    an oscillation element; and
    a resonator coupled to the oscillation element, wherein
    the oscillation element is disposed inside a cavity having at least one opening portion,
    the resonator is disposed completely outside the cavity, and
    the oscillation element and the resonator are coupled inside the cavity.

2. An oscillator used in the high frequency band comprising:
    an oscillation element; and
    a resonator coupled to the oscillation element,
    wherein the oscillation element is disposed inside a cavity having at least one opening portion,
    wherein a portion or the whole of the resonator is disposed outside the cavity,
    wherein the oscillation element and the resonator are coupled inside the cavity, and
    the resonance frequency of the cavity is away from a fundamental frequency of a mode to be used and frequencies of higher modes.

3. An oscillator according to claim 1, wherein the oscillation element is an FET or a Gunn diode.

4. An oscillator according to claim 1, wherein the resonator is a microstrip line resonator or a dielectric resonator.

5. An oscillator according to claim 1, wherein said cavity having said at least one opening portion is provided in a case.

* * * * *